United States Patent
Hardy et al.

(10) Patent No.: US 7,849,315 B2
(45) Date of Patent: Dec. 7, 2010

(54) METHOD FOR MANAGING OPERABILITY OF ON-CHIP DEBUG CAPABILITY

(75) Inventors: Douglas A. Hardy, Scottsdale, AZ (US); Francis G. Sydnor, Scottsdale, AZ (US); William K. Oh, Chandler, AZ (US)

(73) Assignee: General Dynamics C4 Systems, Inc., Scottsdale, AZ (US)

( * ) Notice: Subject to any disclaimer, the term of this patent is extended or adjusted under 35 U.S.C. 154(b) by 1234 days.

(21) Appl. No.: 11/438,998

(22) Filed: May 22, 2006

(65) Prior Publication Data

US 2007/0271461 A1    Nov. 22, 2007

(51) Int. Cl.
*H04L 9/32* (2006.01)
*G06F 21/00* (2006.01)

(52) U.S. Cl. ....................... 713/170; 713/187
(58) Field of Classification Search ................. 713/176; 717/124; 714/732
See application file for complete search history.

(56) References Cited

U.S. PATENT DOCUMENTS

| | | | |
|---|---|---|---|
| 5,898,862 A | 4/1999 | Vajapey | |
| 6,145,122 A | 11/2000 | Miller et al. | |
| 6,167,365 A | 12/2000 | Karthikeyan et al. | |
| 6,289,300 B1 | 9/2001 | Brannick et al. | |
| 6,757,829 B1 * | 6/2004 | Laczko et al. | 713/187 |
| 6,973,592 B2 | 12/2005 | Debling | |
| 7,131,046 B2 * | 10/2006 | Volkerink et al. | 714/732 |
| 7,539,868 B2 * | 5/2009 | Balard et al. | 713/176 |
| 2003/0126350 A1 | 7/2003 | Murdock et al. | |
| 2004/0019827 A1 | 1/2004 | Rohfleisch et al. | |
| 2004/0167859 A1 * | 8/2004 | Mirabella | 705/59 |

OTHER PUBLICATIONS

Charles Swingler, On-Chip Emulation for Functional Test and Diagnosis, EE-Evaluation Engineering, Mar. 2003, Nelson Publishing Inc.

* cited by examiner

*Primary Examiner*—Gilberto Barron, Jr.
*Assistant Examiner*—Samson B Lemma
(74) *Attorney, Agent, or Firm*—Meschkow & Gresham, P.L.C.

(57) ABSTRACT

A method for managing operability of an on-chip debug capability (24) in a product (26) configured to execute software (30) includes storing (74, 76) a debug public key (40) and an operational public key (44) in product memory (54). The software (30) with either a debug signature (82) or an operational signature (88) is saved (84) in the memory (56). When enablement indication is received, the debug signature (82) is validated (102) using the debug public key (40). The debug capability (24) is enabled upon validation of the signature (82) and the software (30) is allowed to execute. When disablement indication is received, the operational signature (88) is verified (112) using the operational public key (44). The on-chip debug capability (24) is disabled upon verification of the signature (88) and the software (30) is allowed to execute.

13 Claims, 4 Drawing Sheets

METHOD FOR MANAGING OPERABILITY OF ON-CHIP DEBUG CAPABILITY

GOVERNMENT RIGHTS

This invention was made with Government support under Contract No. W15P7T-04-C-E405 awarded by the National Security Agency. The Government has certain rights in this invention.

TECHNICAL FIELD OF THE INVENTION

The present invention relates to the field of testing and debugging integrated circuits. More specifically, the present invention relates to the management of on-chip debugging capability in an integrated circuit.

BACKGROUND OF THE INVENTION

Ongoing developments in the semiconductor industry have led to more and more circuitry being placed on a single integrated circuit. Therefore, a large number of functions, which formerly would have been distributed across multiple integrated circuits mounted on a printed circuit board, may now be aggregated on the single integrated circuit, generally known as a microchip. This aggregation, sometimes referred to as a system-on-a-chip (SOC), has the advantage of reducing the number of components in a system, as well as reducing cost, overall power consumption, manufacturing complexity, and so forth.

SOCs typically use embedded processors, i.e., programmable microcontroller and digital signal processor cores, coupled to embedded memories and a myriad of peripheral modules on a single integrated circuit. Examples of devices having embedded processors are cellular telephones, computer printers, high performance disk drives for computer data, automobile control systems, and the like. As a result of the rapid development and commercialization of SOCs, product developers are faced with the overwhelming task of realizing these complex devices with increasingly reduced visibility of subsystem interaction. One problem associated with the development of an SOC is the design validation and debugging of programs which are to run on the SOC.

A variety of approaches have evolved to develop and debug programs on embedded processors. One such approach is to integrate or embed emulation circuits in the processor, sometimes referred to as "on-chip emulation." This approach is becoming increasingly common as embedded processors have achieved progressively higher processing speeds and register widths, thus increasing the needed output bandwidth. This type of emulation, referred to herein as on-chip debug capability, typically includes circuits to monitor the state of an embedded processor, to configure the state of an embedded processor, and to communicate with an external debug tool. The external debug tool is commonly connected to a host computer running debugging software, and acts as a translator between the on-chip debug capability and the host computer.

Unfortunately, this on-chip debug capability can also be used by hackers and other unauthorized persons to perform reverse engineering on a product to determine how a product operates. This on-chip debug capability can also be exploited to create malicious code and viruses to make a product perform functions that were not intended by the product developer. In order to prevent this, it is desirable to provide means by which the original product developer is permitted to use the on-chip debug capability during product development and field debug, but to disable the on-chip debug capability in operational field usage to prevent others from misusing this capability.

Traditionally, this has been accomplished by producing two different products, one with on-chip debug capabilities for product development and one with on-chip debug capabilities removed for operational fielded products. This is an expensive solution that prevents use of on-chip debug capabilities for legitimate field debug needs. In addition, this "solution" creates a situation in which differences exist between the development and operational environments. Other techniques include methods to cut traces, or otherwise disconnect the debug capability connections in a fielded product. These techniques offer little real protection and adversaries can readily learn how to re-connect the on-chip debug capabilities.

Thus what is needed is a technique for selectively enabling an on-chip debug capability for those who are authorized to utilize the capability.

SUMMARY OF THE INVENTION

Accordingly, it is an advantage of the present invention that a method is provided for managing operability of an on-chip debug capability in a product configured to execute software.

It is another advantage of the present invention that a method is provided by which an authorized individual is permitted to use the on-chip debug capability during product development and field debug.

Another advantage of the present invention is that a method is provided for managing operability of an on-chip debug capability that disables the on-chip debug capability in operational fielded usage.

The above and other advantages of the present invention are carried out in one form by a method for managing operability of an on-chip debug capability in a product configured to execute software. The method calls for storing a public component of a trust anchor in memory of the product and appending a signature to the software. The software with the appended signature is saved in the memory. The method further calls for detecting an enablement indicator for the on-chip debug capability at the product. The signature appended to the software is validated using the public component of the trust anchor in response to the detecting operation, and the on-chip debug capability is enabled upon validation of the signature.

The above and other advantages of the present invention are carried out in another form by a system within a product for managing operability of an on-chip debug capability in the product, the product being configured to execute software. The system includes non-changeable memory for storing a first public component of a first trust anchor and a second public component of a second trust anchor. The system further includes changeable memory for storing the software having an appended signature, the signature being derived using a private component of one of the first and second trust anchors. A processor is in communication with each of the non-changeable memory and the changeable memory. The processor receives one of an enablement indicator and a disablement indicator for the on-chip debug capability. When the enablement indicator is received the processor validates the signature using the first public component of the first trust anchor and enables the on-chip debug capability upon validation of the signature. When the disablement indicator is received, the processor verifies the signature using the second public component of the second trust anchor and disables the on-chip debug capability upon verification of the signature.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

The present invention teaches of a method and system for selectively enabling an on-chip debug capability within a product capable of executing software. The product may be an embedded system, a workstation, a communication system, and the like, that incorporates integrated circuit technologies. As such, the product is a program-controlled unit that includes a microprocessor, microcontroller, signal processor, and so forth. The methodology can be readily implemented into various products, each having programmable, executable software for which the product developer desires to include on-chip debug capability. The term "software" used herein refers to that part of a computing product that includes encoded information (or instructions), as opposed to the physical computing equipment (hardware) which is used to store and process this encoded information.

Figure 1:
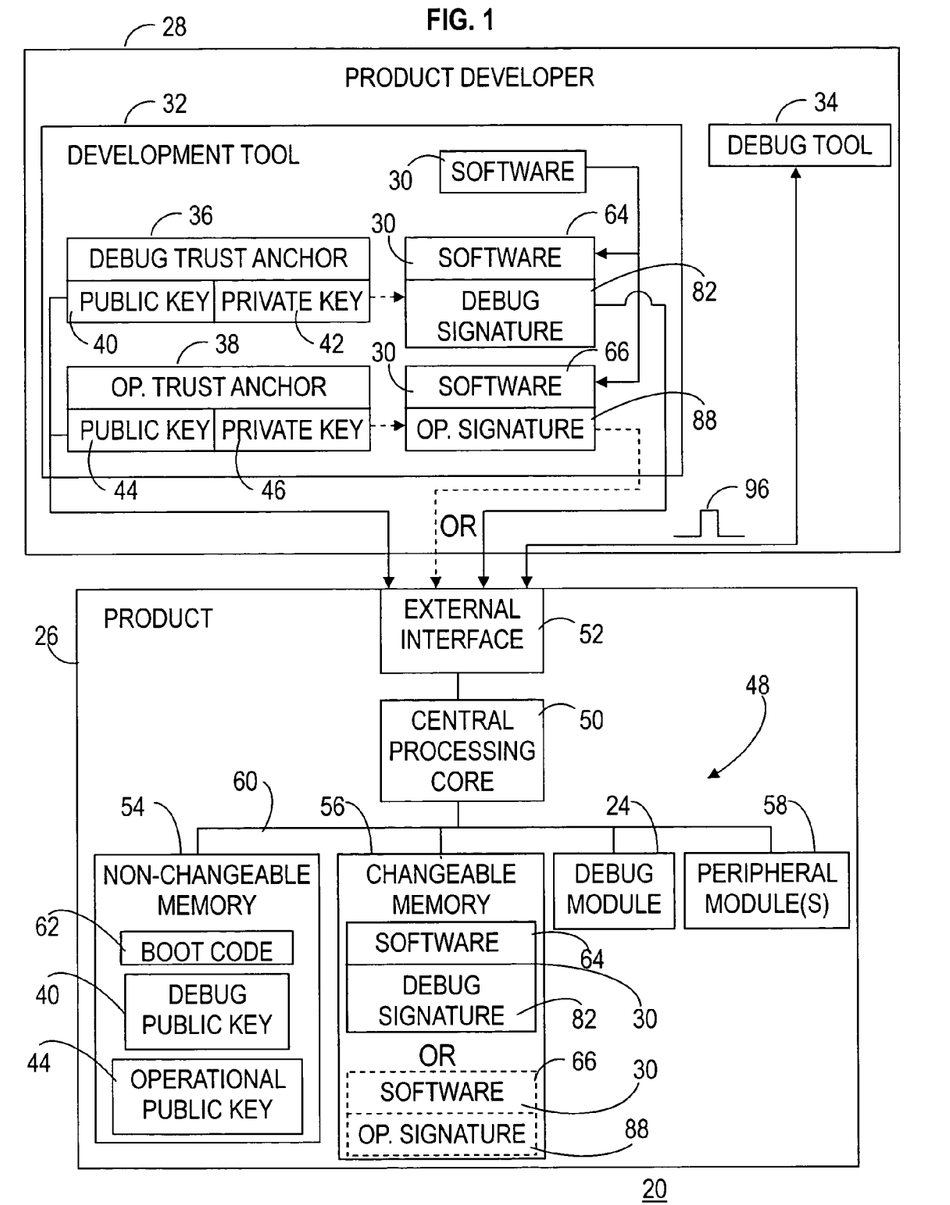
FIG. 1 shows a block diagram of an arrangement in which operability management of an on-chip debug capability in a product may be employed accordance with a preferred embodiment of the present invention.

FIG. 1 shows a block diagram of an environment 20 in which operability management of an on-chip debug capability 24 in a product 26 may be employed in accordance with a preferred embodiment of the present invention. Environment 20 includes a product developer 28 who is developing product 26 and/or software 30, to be installed into product 26, on a development tool 32. In accordance with the present invention, product 26 can operate with on-chip debug capability 24 enabled for product development and field debug or product 26 can operate with on-chip debug capability 24 disabled for operational fielded use.

Development tool 32 may be a host computer and associated components operatively coupled to product 26 for downloading software 30 to product 26. Product developer 28 may also have a debug tool 34 operatively coupled to product 26 for performing testing, design verification, and debugging activities associated with the development of product 26. Debug tool 34 can include circuitry necessary for interfacing with product 26 and functions to assist product developer 28 during testing, design verification, and debugging activities. Development tool 32 and debug tool 34 need not be distinct components. Rather, a common computing system and components may execute the functions of both development and debug tools 32 and 34, respectively, as known to those skilled in the art.

In accordance with the present invention, product developer 28 manages a first trust anchor, referred to herein as a debug trust anchor 36, and a second trust anchor, referred to herein as an operational trust anchor 38. Debug trust anchor 36 is utilized to enable on-chip debug capability 24 and authenticate software 30 during product development and field debug. Whereas, operational trust anchor 38 is utilized to disable on-chip debug capability 24 and authenticate software 30 for operational fielded use. Product developer 28 may manage other trust anchors not distinguished herein for brevity.

Debug trust anchor 36 is a cryptographic key pair that includes a first public component, i.e., a debug public key 40, and a first private component, i.e., a debug private key 42. Similarly, operational trust anchor 38 is a cryptographic key pair that includes a second public component, i.e., an operational public key 44, and a second private component, i.e., an operational private key 46. In a preferred embodiment, debug public key 40 and operational public key 44 are hard coded into product 26 and are permanent for the life of software 30. Alternatively, debug public key 40 and operational public key 44 may be coded into product 26 utilizing known techniques that permit trust anchors to be changed in a controlled and protected manner.

Product 26 may be an integrated circuit 48 or may be a larger system of which integrated circuit 48 forms a portion thereof. Integrated circuit 48 may incorporate system-on-a-chip (SOC) technology, for example, as an application specific integrated circuit (ASIC). Integrated circuit 48 preferably includes a central processing core 50 on which selective enablement of on-chip debug capability 24 in accordance with the present invention can be practiced. The term "central processing core" includes microprocessors, microcontrollers, digital signal processors, and the like known to those skilled in the art.

Central processing core 50 is in communication with an external interface 52, a non-changeable memory element 54, and a changeable memory element 56, on-chip debug capability 24 (a.k.a. debug module 24), and one or more peripheral modules 58 for carrying out the particular work for which product 26 is designed. These elements may be interconnected by a bus structure 60. These elements provide a system for managing operability of on-chip debug capability 24 and software authentication in product 26, and may serve additional purposes not critical to understanding the present invention.

External interface 52 provides external path means for enabling communication between product 26 and components operated by product developer 28, i.e., development tool 32 and debug tool 34. For example, external interface may be a port, such as a Universal Serial Bus (USB) port, for cabled attachment to a corresponding port on development tool 32 and/or debug tool 34 operated by developer 28.

Non-changeable memory 54 is a storage medium, such as read-only memory (ROM), whose contents can be accessed and read, but cannot be changed. Non-changeable memory 54 may be loaded with data and programs by product developer 28 during manufacture and can subsequently only be read, not written to, by central processing core 50. Such data and programs can include microcode or boot code 62, debug public key 40, and operational public key 44, discussed below. The contents of non-changeable memory 54 are not lost when the power is switched off.

Changeable memory 56 may be an external or internal non-volatile storage medium such as flash memory, magnetic computer storage device, optical disk, erasable programmable read-only memory (EPROM), and the like. Changeable memory 56 may be loaded with programs and data during manufacture and may later be erased and re-loaded with new and/or updated programs and data. Such data and programs can include debug capability enabled signed software 64 or debug capability disabled signed software 66, each of which will be discussed below.

Signed software 66 is illustrated in product 26 with dashed lines and separated from signed software 64 with the term "or" to emphasize that only one of debug capability enabled signed software 64 or debug capability disabled signed software 66 may be stored in changeable memory 56 in accordance with the present invention. Preferably, debug capability enabled signed software 64 is saved in changeable memory 56 when product 26 is configured for product development and/or field debug. Alternatively, debug capability disabled signed software 66 is saved in changeable memory 56 when product 26 is configured for operational fielded use.

On-chip debug capability 24 is logic that enables product developer 28 to debug software 30. On-chip debug capability 24 may provide breakpointing, single stepping, and external breaking, as known to those skilled in the art. Breaks may be treated as a special form of interrupt that vectors to debug executive software implemented at debug tool 34 by product developer 28. On-chip debug capability 24 is also preferably capable of outputting trace information. For this purpose, the occurrence within product 26 of conditions which can be predefined from outside product 26 is monitored by on-chip debug capability 24. Thus, predefined addresses, data, and/or control signals may be output from product 26 via external interface 52 whenever the condition or one of the conditions is fulfilled without interrupting the operation of product 26. On-chip debug capability 24 can also carry out further actions that are necessary or helpful for the localization and elimination of faults occurring in product 26.

In general, environment 20 provides methodology, discussed below, for utilizing cryptographic techniques to ensure secure enablement of on-chip debug capability 24 within product 26 for authorized individuals, and to ensure disablement of on-chip debug capability 24 within product 26 for unauthorized individuals.

Figure 2:
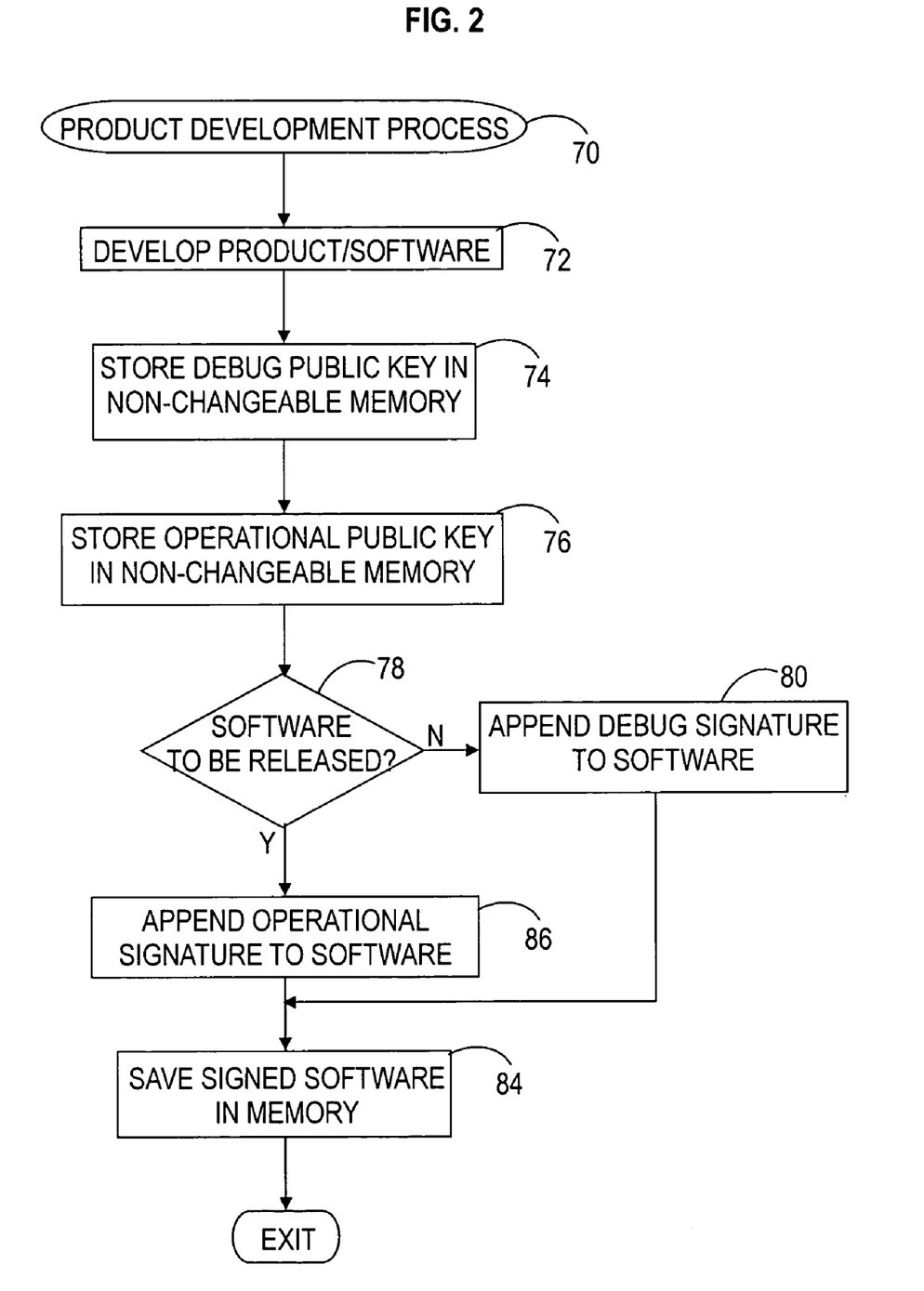
FIG. 2 shows a flowchart of a product development process in accordance with the present invention.

Referring now to FIGS. 1 and 2, FIG. 2 shows a flowchart of a product development process 70 in accordance with the present invention. Product development process 70 is performed by product developer 28 during the development of product 26 to ensure secure enablement of on-chip debug capability 24 present on integrated circuit 48 of product 26.

Product development process 70 begins with a task 72. At task 72, product developer 28 develops product 26 and software 30. Product 26, more specifically integrated circuit 48, may be designed and fabricated, or otherwise obtained, by product developer 28. In addition, software 30, to be executed by central processing core 50 of integrated circuit 48 may be designed, written, and tested by product developer 28 to perform the necessary functions of product 26 in accordance with customary practices.

A task 74 is performed in connection with task 72. At task 74, product developer 28 stores a first public component, i.e., debug public key 40 of debug trust anchor 36, in non-changeable memory 54 on integrated circuit 48 of product 26.

Next, a task 76 is performed. At task 76, product developer 28 stores a second public component, i.e., operational public key 44 of operational trust anchor 38, in non-changeable memory 54 on integrated circuit 48 of product 26.

Following tasks 72, 74, and 76, a query task 78 is performed. At query task 78, a determination is made by product developer 28 as to whether this current build of software 30 is ready for release. That is, query task 78 is performed to determine whether software 30 is ready for operational fielded use or is still under development. Per convention, a build is a pre-release version of software 30. Reiterative (repeated) builds of software 30 are an important part of the development process. However, since software 30 is still under development during these reiterative builds, it may be desirable to enable on-chip debug capability 24. Accordingly, when query task 78 determines that software 30 is not ready for release, i.e., this latest version of software 30 is a pre-release version, process 70 proceeds to a task 80.

At task 80, product developer 28 appends a first signature, referred to herein as a debug signature 82 (see FIG. 1), to software 30 using debug private key 42 of debug trust anchor 36. For example, product developer 28 may implement a signing algorithm to generate a message digest and encrypt the generated message digest with debug private key 42 to form the digital signature, i.e., debug signature 82. Debug signature 82 is then applied to software 30 to form debug capability enabled signed software 64. As known to those skilled in the art, debug signature 82 may take the form of a simple numerical value (normally represented as a string of binary digits). For efficiency, product developer 28 may first apply a cryptographic hash function to software 30 before signing, as also known to those skilled in the art. Following task 80, product development process 70 proceeds to a task 84, discussed below.

However, when query task 78 determines that this latest version of software 30 is a release version ready for operational fielded use, process 70 proceeds to a task 86. At task 86, product developer 28 appends a second signature, referred to herein as an operational signature 88 (see FIG. 1), to software 30 using operational private key 46 of operational trust anchor 38. Operational signature 88 is then applied to software 30 to form debug capability disabled signed software 66. Following task 86, product development process 70 also proceeds to task 84.

At task 84 following either of tasks 80 or 86, product developer 28 saves the signed software, either debug capability enabled signed software 64 or debug capability disabled signed software 66 in changeable memory 56 on integrated circuit 48 of product 26. Following task 84, product development process 70 exits. The outcome of product development process 70 is software 30 saved in changeable memory 56 within product 26 that is signed, i.e., appended with, a digital signature. This digital signature, either debug signature 82 or operational signature 88, selectively enables or disables on-chip debug capability 24 of integrated circuit 48 within product 26 and authenticates software 30.

Figure 3:
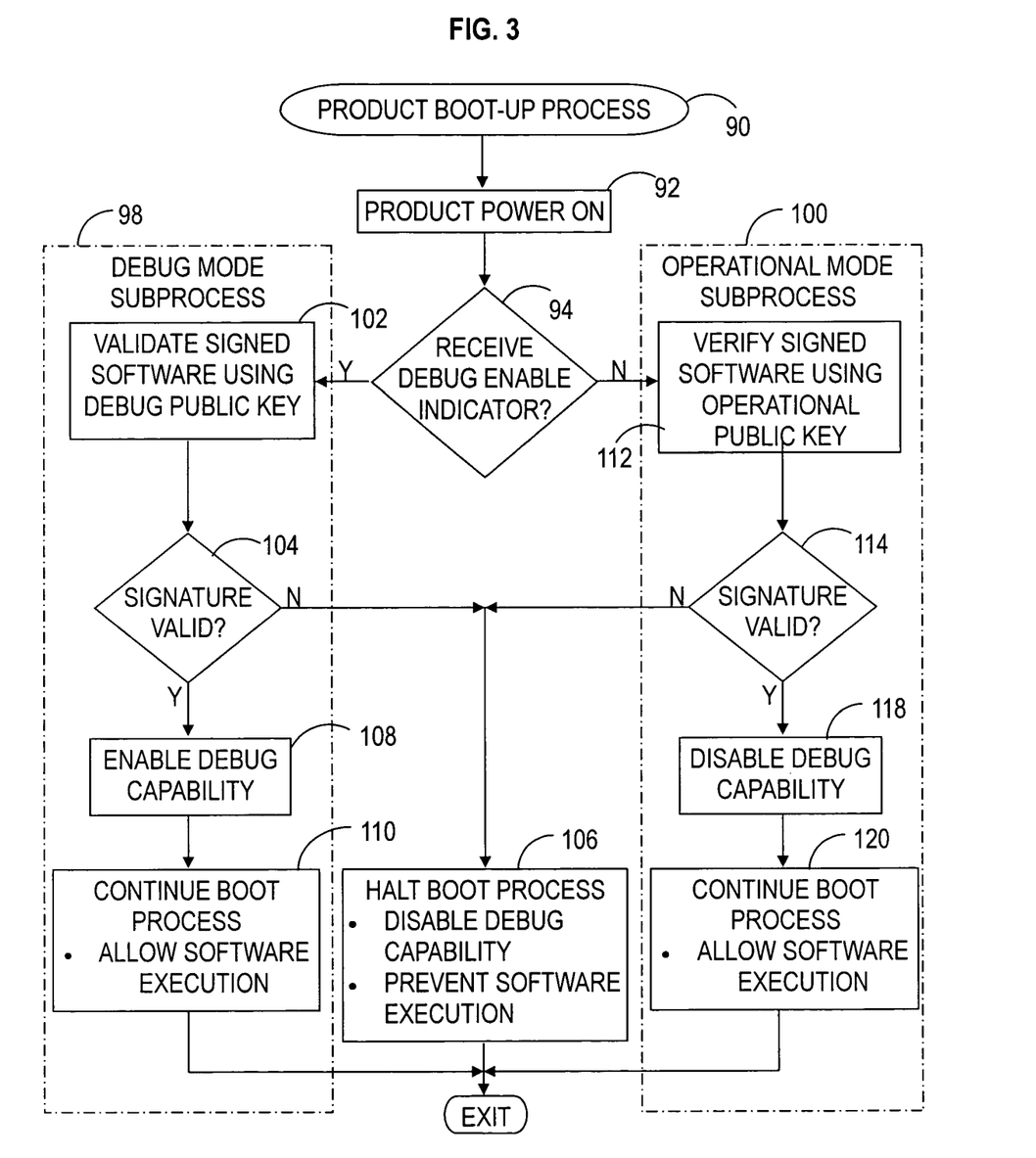
FIG. 3 shows a flowchart of a product boot-up process in accordance with the present invention.

Referring now to FIGS. 1 and 3, FIG. 3 shows a flowchart of a product boot-up process 90 in accordance with the present invention. Boot-up process 90 is performed through the execution of microcode, e.g. boot code 62, to establish one of a debug mode (with debug capability 24 enabled) or an operational mode (with debug capability 24 disabled) in which product 26 will be allowed to execute.

Thus, product boot-up process 90 begins with a task 92. At task 92, a power on attempt of product 26 including integrated circuit 48 is detected.

In response to task 92, a query task 94 is performed. At query task 94, a determination is made as to whether a debug enablement indicator 96 is received at product 26. In a preferred embodiment, debug enablement indicator 96 may be a hardware enablement signal that registers a change of state from low to high. This change of state may be detected by product 26 through an external pin interconnecting external interface 52 with debug tool 34.

When a determination is made at query task 94 that debug enablement indicator 96 has been received, product boot-up process 90 performs a debug mode subprocess 98 (generally delineated by dashed lines). Debug mode subprocess 98 is a validation subprocess that allows enablement of on-chip debug capability 24 and execution of software 30 when debug signature 82 is validated. However, when a determination is made at query task 94 that debug enablement indicator 96 has not been received, i.e., thereby implying debug disablement indication, product boot-up process 90 performs an operational mode subprocess 100 (also generally delineated by dashed lines. Operational mode subprocess 100 is another validation subprocess that ensures disablement of on-chip debug capability 24 and execution of software 30 when operational signature 88 is validated.

Referring first to debug mode subprocess 98 in response to receipt of debug enable indicator 96 at query task 94, product boot-up process 90 continues with a task 102.

At task 102, signed software 30 is validated using debug public key 40 stored in non-changeable memory 54. It may be recalled that either debug capability enabled signed software 64 or debug capability disabled signed software 66 is saved in changeable memory 56. At task 102, the saved one of either signed software 64 or signed software 66 is validated using debug public key 40. Validation of the saved one of either signed software 64 or signed software 66 is attempted using debug public key 40. If, however, debug capability disabled signed software 66 is contained in memory 56, then signature validation at task 102 using debug public key 40 will be unsuccessful. In order to explain debug mode subprocess 98, it will be assumed that debug capability enabled signed software 64 is saved in changeable memory 56. Validation entails decrypting debug signature 82 using debug public key 40.

A query task 104 is performed in connection with task 102. Query task 104 determines whether debug signature 82 is valid. That is, query task 104 determines whether debug signature 82 can be decrypted using debug public key 40. When debug signature 82 cannot be decrypted using debug public key 40 (i.e., validation at task 102 is unsuccessful), debug mode subprocess 98 of product boot-up process 90 proceeds to a task 106.

At task 106, boot-up of product 26 is halted, with on-chip debug capability 24 disabled and the execution of software 30 prevented. Task 106 is performed because it is assumed that software 30 may be under attack by a hacker or another unauthorized person for nefarious purposes. Following task 106, product boot-up process 90 exits with product 26, and more particularly, central processing core 50 on integrated circuit 48, in a non-operational condition.

When query task 104 determines that debug signature 82 can be decrypted using debug public key 40, debug mode subprocess 98 proceeds to a task 108. At task 108, on-chip debug capability 24 is enabled.

A task 110 performed in connection with task 108. At task 110, boot-up of product 26 is allowed to continue. In addition, since debug signature 82 was found to be valid, software 30 is authenticated and allowed to execute. Following task 110, product boot-up process 90 exits with product 26, and more particularly, central processing core 50 on integrated circuit 48, in an operational condition with on-chip debug capability 24 enabled for development and/or field debug purposes.

Referring now to operational mode subprocess 100 in response to non-receipt of debug enable indicator 96 at query task 94, product boot-up process 90 continues with a task 112.

At task 112, signed software 30 is verified using operational public key 44 stored in non-changeable memory 54. Again, it should be recalled that either debug capability enabled signed software 64 or debug capability disabled signed software 66 is saved in changeable memory 56. Verification of the saved one of either signed software 64 or signed software 66 is attempted using operational public key 44. If, however, debug capability enabled signed software 64 is contained in memory 56, then signature verification at task 112 using operational public key 44 will be unsuccessful. In order to explain operational mode subprocess 100, it will be assumed that debug capability disabled signed software 66 is saved in changeable memory 56. Validation entails decrypting operational signature 88 using operational public key 44.

A query task 114 is performed in connection with task 112. Query task 114 determines whether operational signature 88 is valid. That is, query task 114 determines whether operational signature 88 can be decrypted using operational public key 44. When operational signature 88 cannot be decrypted using operational public key 44 (i.e. verification at task 112 is unsuccessful), operational mode subprocess 100 of product boot-up process 90 proceeds to task 106.

Again, at task 106, boot-up of product 26 is halted, with on-chip debug capability 24 disabled and the execution of software 30 prevented. Following task 106, product boot-up process 90 exits with product 26, and more particularly, central processing core 50 on integrated circuit 48, in a non-operational condition.

When query task 114 determines that operational signature 88 can be decrypted using operational public key 44, operational mode subprocess 100 proceeds to a task 118. At task 118, on-chip debug capability 24 is disabled. Alternatively, if on-chip debug capability 24 defaults at power on to a disabled state, the disablement of on-chip debug capability 24 is maintained at task 118.

A task 120 is performed in connection with task 118. At task 120, boot-up of product 26 is allowed to continue. In addition, since operational signature 88 was found to be valid, software 30 is authenticated and allowed to execute. Following task 120, product boot-up process 90 exits with product 26, and more particularly, central processing core 50 on integrated circuit 48, in an operational condition with on-chip debug capability 24 disabled for operational fielded use.

Product boot-up process 90 is performed to enable, or alternatively, disable on-chip debug capability 24, and concurrently authenticate software 30 in either situation. However, the present methodology may be adapted to only authenticate software 30 when debug capability 24 is to be enabled. By way of example, product developer 28 may save either debug capability enabled signed software 64 or, alternatively, software 30 (without a digital signature) in changeable memory 56. In such a situation, debug signature 82 may be validated through execution of debug mode subprocess 98. However, whenever debug capability 24 is disabled software 30, or any other software, could be executed. This situation protects on-chip debug capability 24, but does not provide authentication of software 30 in product 26 configured for operational fielded use.

Figure 4:
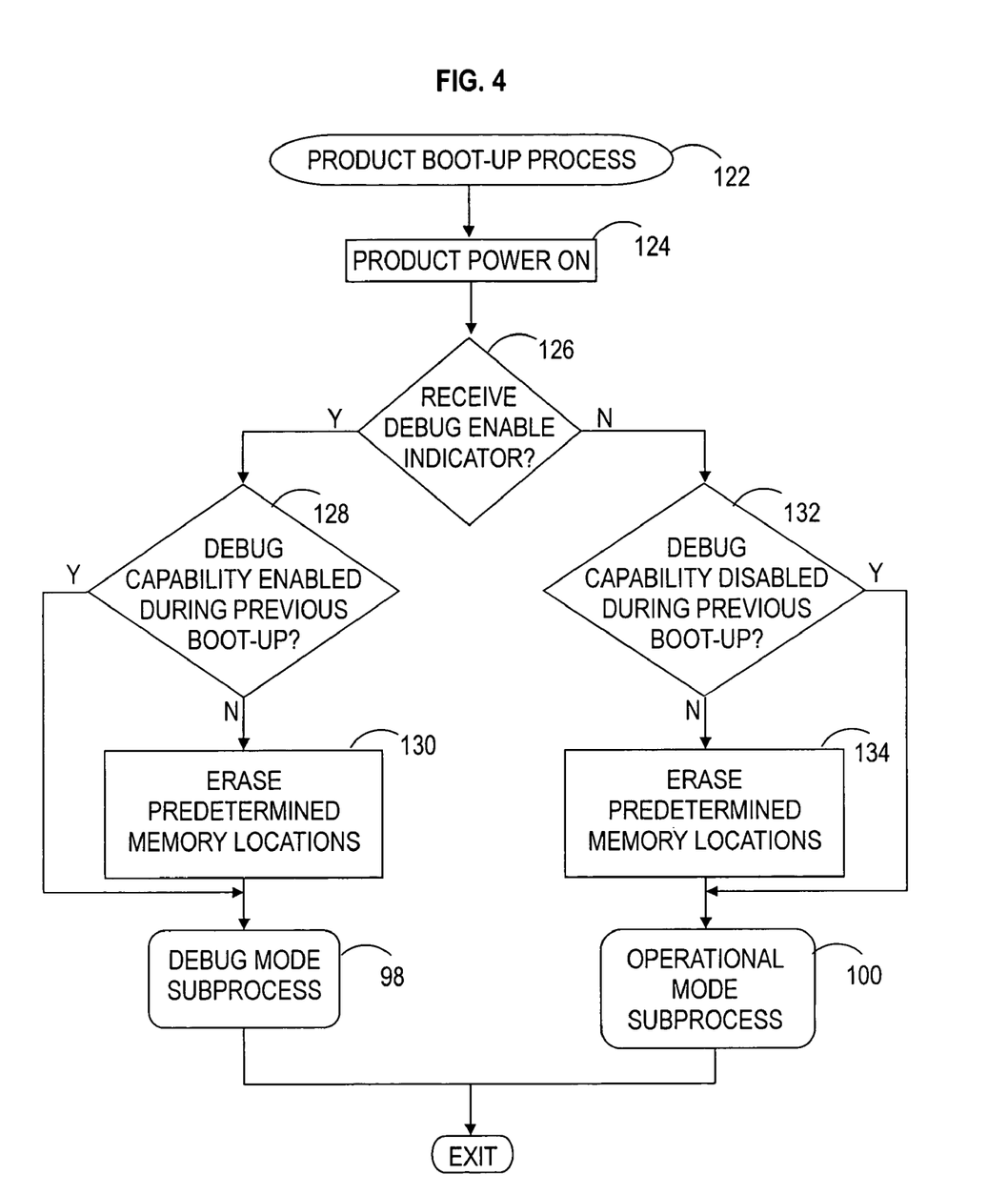
FIG. 4 shows a flowchart of a product boot-up process in accordance with an alternative embodiment of the present invention.

FIG. 4 shows a flowchart of a product boot-up process 122 in accordance with an alternative embodiment of the present invention. Product boot-up process 122 is performed to monitor for and react to a change of state of on-chip debug capability 24 (FIG. 1) from enabled to disabled, or alternatively, disabled to enabled.

Process 122 begins with a task 124. At task 124, a power on attempt of product 26 including integrated circuit 48 is detected.

In response to task 124, a query task 126 is performed. Similar to query task 94 (FIG. 3), at query task 126, a determination is made as to whether debug enablement indicator 96 is received at product 26.

When a determination is made at query task 126 that debug enablement indicator 96 has been received, product boot-up process 122 proceeds to a query task 128.

At query task 128, a determination is made as to whether debug capability 24 (FIG. 1) was enabled during a previous boot-up attempt. For example, a memory location (not shown) on integrated circuit 48 (FIG. 1) and associated with boot code 62 (FIG. 1) may store an marker indicating the previous power up mode (either debug capability 24 enabled or debug capability 24 disabled). When query task 128 detects a state change from previously disabled to now attempting enablement of debug capability 24, process 122 proceeds to a task 130.

At task 130, central processing core 50 (FIG. 1) automatically erases any memories locations (predetermined by product developer 28 (FIG. 1) that contain sensitive information or could contain malicious code. Following task 130, debug mode subprocess 98 is performed, as discussed above.

However, when query task 128 does not detect a state change. That is, when debug capability 24 was previously enabled, process control proceeds to debug mode subprocess 98, bypassing erasure task 130. Following debug mode subprocess 98, product boot-up process 122 exits.

In response to non-receipt of debug enable indicator 96 at query task 126, product boot-up process 122 continues with a query task 132.

At query task 132, a determination is made as to whether debug capability 24 (FIG. 1) was disabled during a previous boot-up attempt. Again, the memory location may be accessed to determine the previous power up mode (either debug capability 24 enabled or debug capability 24 disabled). When query task 132 detects a state change from previously enabled to now attempting disablement of debug capability 24, process 122 proceeds to a task 134.

At task 134, central processing core 50 (FIG. 1) automatically erases any memories locations (predetermined by product developer 28 (FIG. 1) that contain sensitive information or could contain malicious code. Following task 134, operational mode subprocess 100 is performed, as discussed above.

However, when query task 132 does not detect a state change. That is, when debug capability 24 was previously disabled, process control proceeds to operational mode subprocess 100, bypassing erasure task 134. Following operational mode subprocess 100, product boot-up process 122 exits.

Product boot-up process 122 provides means by which an intruder is prevented from moving to a debug state from an operational state in order to extract operational information. In addition, execution of product boot-up process 122 prevents the loading of a virus in a debug state that will operate while in an operational state.

In summary, the present invention teaches of a method for managing operability of an on-chip debug capability in a product configured to execute a software. The methodology employs a cryptographic technique utilizing digital signatures by which an authorized individual can enable the on-chip debug capability and authenticate the software during product development and field debug. The cryptographic technique is further employed to disable the on-chip debug capability and authenticate the software in operational fielded usage.

Although the preferred embodiments of the invention have been illustrated and described in detail, it will be readily apparent to those skilled in the art that various modifications may be made therein without departing from the spirit of the invention or from the scope of the appended claims. For example, the process steps discussed herein can take on a number of variations and can be performed in a differing order than that which was presented.

What is claimed is:

1. A method for managing operability of an on-chip debug capability in a product configured to execute software comprising:
    storing a first public component of a first trust anchor and a second public component of a second trust anchor in a memory of said product;
    appending a signature to said software;
    saving said software with said appended signature in said memory;
    detecting an enablement indicator for said on-chip debug capability at said product;
    validating, in response to said detecting operation, said signature appended to said software using said public component of said trust anchor;
    enabling said on-chip debug capability upon validation of said signature;
    determining a disablement indicator for said on-chip debug capability;
    verifying, in response to said determining operation, said signature appended to said software using said second public component of said second trust anchor; and
    disabling said on-chip debug capability upon verification of said signature.

2. A method as claimed in claim 1 wherein said appending operation comprises signing said software using a private component of one of said first trust anchor and said second trust anchor.

3. A method as claimed in claim 1 further comprising allowing execution of said software in response to said disabling operation.

4. A method as claimed in claim 1 further comprising preventing execution of said software upon non-verification of said signature using said second public component.

5. A method for managing operability of an on-chip debug capability in a product configured to execute software comprising:
    storing a first public component of a first trust anchor and a second public component of a second trust anchor in memory of said product;
    appending a signature to said software;
    saving said software with said appended signature in said memory;
    receiving one of an enablement indicator and a disablement indicator for said on-chip debug capability at said product;
    when said enablement indicator is received, validating said signature using said first public component of said first trust anchor and enabling said on-chip debug capability upon validation of said signature; and
    when said disablement indicator is received, verifying said signature using said second public component of said second trust anchor and disabling said on-chip debug capability upon verification of said signature.

6. A method as claimed in claim 5 wherein said appending operation comprises signing said software using a private component of one of said first trust anchor and said second trust anchor.

7. A method as claimed in claim 5 further comprising:
    determining, in response to said validating operation, that said signature is invalid; and
    disabling said on-chip debug capability upon invalidation of said signature.

8. A method as claimed in claim 5 further comprising:
    determining, in response said validating operation that said signature is invalid; and preventing execution of said software upon invalidation of said signature.

9. A method as claimed in claim 5 further comprising:
determining, in response to said verifying operation that said signature is non-verified; and
preventing execution of said software upon non-verification of said signature.

10. A method as claimed in claim 5 wherein said receiving operation occurs during a power-up attempt, and said method further comprises:
remembering, at said product, a state of said on-chip debug capability from a previous power-up attempt, said state being one of an enablement state and a disablement state of said on-chip debug capability;
ascertaining, in response to said receiving operation, a change in said state to the other of said enablement and disablement states; and
automatically erasing predetermined memory locations in said product in response to said ascertaining operation.

11. A system within a product for managing operability of an on-chip debug capability in said product, said product being configured to execute software, and said system comprising:
non-changeable memory for storing a first public component of a first trust anchor and a second public component of a second trust anchor;
changeable memory for storing said software having an appended signature, said signature being derived using a private component of one of said first and second trust anchors; and
a processor in communication with each of said non-changeable memory and said changeable memory, said processor receiving one of an enablement indicator and a disablement indicator for said on-chip debug capability, and when said enablement indicator is received, said processor validates said signature using said first public component of said first trust anchor and enables said on-chip debug capability upon validation of said signature, and when said disablement indicator is received, said processor verifies said signature using said second public component of said second trust anchor and disables said on-chip debug capability upon verification of said signature.

12. A system as claimed in claim 11 wherein said processor disables said on-chip debug capability upon invalidation of said signature.

13. A system as claimed in claim 11 wherein said processor prevents execution of said software upon non-verification of said signature.

* * * * *